US009686617B2

(12) United States Patent
Doller et al.

(10) Patent No.: US 9,686,617 B2

(45) Date of Patent: Jun. 20, 2017

(54) MICROPHONE SYSTEM WITH DRIVEN ELECTRODES

(71) Applicant: Robert Bosch GmbH, Stuttgart (DE)

(72) Inventors: Andrew J. Doller, Sharpsburg, PA (US); Sucheendran Sridharan, McMurray, PA (US)

(73) Assignee: Robert Bosch GmbH, Stuttgart (DE)

(*) Notice: Subject to any disclaimer, the term of this patent is extended or adjusted under 35 U.S.C. 154(b) by 112 days.

(21) Appl. No.: 14/676,445

(22) Filed: Apr. 1, 2015

(65) Prior Publication Data

US 2015/0281818 A1 Oct. 1, 2015

Related U.S. Application Data

(60) Provisional application No. 61/973,517, filed on Apr. 1, 2014.

(51) Int. Cl.

*H04R 25/00* (2006.01)
*H04R 19/00* (2006.01)
*H01L 29/84* (2006.01)

(52) U.S. Cl.

CPC ..... *H04R 19/005* (2013.01); *H04R 2201/003* (2013.01)

(58) Field of Classification Search

CPC .. H04R 19/005; H04R 2201/003; H04R 9/08; B81B 7/008; B81B 3/0021
USPC ......... 381/174, 111, 113, 114; 257/416, 419, 257/E29.324
See application file for complete search history.

(56) References Cited

U.S. PATENT DOCUMENTS

| | | | | |
|---|---|---|---|---|
| 6,898,292 | B2 | 5/2005 | Tanabe et al. | |
| 6,947,568 | B2 | 9/2005 | Tanabe et al. | |
| 8,265,309 | B2 | 9/2012 | Zhang | |
| 8,831,246 | B2 * | 9/2014 | Josefsson | H04R 3/00 381/107 |
| 2009/0322260 | A1 | 12/2009 | Lee | |
| 2012/0076322 | A1 | 3/2012 | Kimura et al. | |
| 2012/0076339 | A1 | 3/2012 | Buck et al. | |

(Continued)

FOREIGN PATENT DOCUMENTS

| | | | | |
|---|---|---|---|---|
| DE | 4342169 | A1 | 6/1995 | |
| DK | WO 2012119637 | A1 * | 9/2012 | H04R 19/005 |

*Primary Examiner* — Sunita Joshi

(74) *Attorney, Agent, or Firm* — Michael Best & Friedrich LLP

(57) ABSTRACT

Systems and methods for controlling parameters of a MEMS microphone. The microphone system includes a MEMS microphone and a controller. The MEMS microphone includes a movable electrode, a stationary electrode, and a driven electrode. The movable electrode has a first side and a second side that is opposite the first side. The movable electrode is configured such that acoustic pressures acting on the first side and the second of the movable electrode cause movement of the movable electrode. The stationary electrode is positioned on the first side of the movable electrode. The driven electrode is configured to receive a control signal and alter a parameter of the MEMS microphone based on the control signal. The controller is configured to determine a voltage difference between the movable electrode and the stationary electrode. The controller is also configured to generate the control signal based on the voltage difference.

20 Claims, 18 Drawing Sheets

(56) References Cited

U.S. PATENT DOCUMENTS

| | | | | |
|---|---|---|---|---|
| 2013/0243234 | A1 | 9/2013 | Zoellin et al. | |
| 2015/0076627 | A1* | 3/2015 | Johansen | H04R 19/005<br>257/416 |

* cited by examiner

MICROPHONE SYSTEM WITH DRIVEN ELECTRODES

RELATED APPLICATIONS

This application claims priority to U.S. Provisional Application No. 61/973,517, filed on Apr. 1, 2014 and titled "MULTI-ELECTRODE MICROPHONES," the entire contents of which is incorporated by reference.

BACKGROUND

The present invention relates to microphones, including MEMS microphones. FIG. 1 illustrates a conventional MEMS microphone 100. The MEMS microphone 100 includes a movable electrode 105 (i.e., membrane) having a first side 107 and a second side 108, a stationary electrode 110, and a barrier 120. The barrier 120 isolates a first side 125 and a second side 130 of the MEMS microphone 100. Acoustic pressures acting on the first side 107 and the second side 108 of the movable electrode 105 cause movement of the movable electrode 105 in the directions of arrow 145 and 150. Movement of the movable electrode 105 relative to the stationary electrode 110 causes changes in a voltage difference between the movable electrode 105 and the stationary electrode 110. As is known, ambient pressure also acts on the first side 107 and the second side of the movable electrode 105. Further, the movement of the movable electrode 105 is also based on the ambient pressure acting on the movable electrode 105. Although the ambient pressure changes based ambient conditions (e.g., altitude, wind, humidity, etc.), the remaining discussion is focused on acoustic pressures acting on the movable membrane 105.

MEMS microphones 100, such as illustrated in FIG. 1, based purely on mechanical parameters are fixed in their response. FIG. 2 is a graph 200 of an exemplary frequency response 205 of the MEMS microphone 100 illustrated in FIG. 1. The horizontal axis is frequency (in hertz) and the vertical axis is gain (in dB).

SUMMARY

Embodiments of the invention provide, among other things, a microphone system. In one embodiment, the microphone system includes a MEMS microphone and a controller. The MEMS microphone includes a movable electrode, a stationary electrode, and a driven electrode. The movable electrode has a first side and a second side that is opposite the first side. The movable electrode is configured such that acoustic pressures acting on the first side and the second of the movable electrode cause movement of the movable electrode. The stationary electrode is positioned on the first side of the movable electrode. The driven electrode is configured to receive a control signal and alter a parameter of the MEMS microphone based on the control signal. The controller is coupled to the stationary electrode and the driven electrode. The controller is configured to determine a voltage difference between the movable electrode and the stationary electrode. The controller is also configured to generate the control signal based on the voltage difference.

In another embodiment, the invention provides a method for controlling a parameter of a MEMS microphone. The MEMS microphone includes a movable electrode, a stationary electrode, and a driven electrode. The movable electrode has a first side and a second side that is opposite the first side. The movable electrode is configured such that acoustic pressures acting on the first side and the second side of the movable electrode cause movement of the movable electrode. The stationary electrode is positioned on the first side of the movable electrode. The method includes determining, by a controller, a voltage difference between the movable electrode and the stationary electrode. The controller is coupled to the stationary electrode and the driven electrode. The method further includes generating, by the controller, a control signal based on the voltage difference. The method also includes receiving, by the driven electrode, the control signal. The method further includes altering, by the driven electrode, the parameter of the MEMS microphone based on the control signal.

In yet another embodiment, the invention provides a microphone system. In an exemplary implementation, the microphone system includes a MEMS microphone and a controller. The MEMS microphone includes a movable electrode, a first stationary electrode, a second stationary electrode, a first driven electrode, and a second driven electrode. The movable electrode has a first side and a second side that is opposite the first side. The movable electrode is configured such that acoustic pressures acting on the first side and the second side of the movable electrode cause movement of the movable electrode. The first stationary electrode and the second stationary electrode are positioned on the first side of the movable electrode. The first driven electrode and the second driven electrode are positioned on the second side of the movable electrode. The first driven electrode is configured to receive a first control signal and alter a parameter of the MEMS microphone based on the first control signal. The second driven electrode is configured to receive a second control signal and alter the parameter of the MEMS microphone based on the second control signal. The controller is coupled to the first stationary electrode, the second stationary electrode, the first driven electrode, and the second driven electrode. The controller is configured to determine a first voltage difference between the movable electrode and the first stationary electrode. The controller is also configured to determine a second voltage difference between the movable electrode and the second stationary electrode. The controller is further configured to generate the first control signal based on the first voltage difference and the second control signal based on the second voltage difference.

In yet another embodiment, the invention provides a method for controlling a parameter of a MEMS microphone. The MEMS microphone includes a movable electrode, a first stationary electrode, a second stationary electrode, a first driven electrode, and a second driven electrode. The movable electrode has a first side and a second side that is opposite the first side. The movable electrode is configured such that acoustic pressures acting on the first side and the second side of the movable electrode cause movement of the movable electrode. The first stationary electrode and the second stationary electrode are positioned on the first side of the movable electrode. The first driven electrode and the second driven electrode are positioned on the second side of the movable electrode. The method includes determining, by a controller, a first voltage difference between the movable electrode and the first stationary electrode. The method also includes determining, by the controller, a second voltage difference between the movable electrode and the second stationary electrode. The controller is coupled to the first stationary electrode, the second stationary electrode, the first driven electrode, and the second driven electrode. The method further includes generating, by the controller, a first control signal based on the first voltage difference and a second control signal based on the second voltage difference. The method also includes receiving, by the first driven electrode, the first control signal. The method further includes receiving, by the second driven electrode, the second control signal. The method also includes altering, by the first driven electrode, the parameter of the MEMS microphone based on the first control signal. The method further includes altering, by the second driven electrode, the parameter of the MEMS microphone based on the second control signal.

Other aspects of the invention will become apparent by consideration of the detailed description and accompanying drawings.

DETAILED DESCRIPTION

Figure 1:
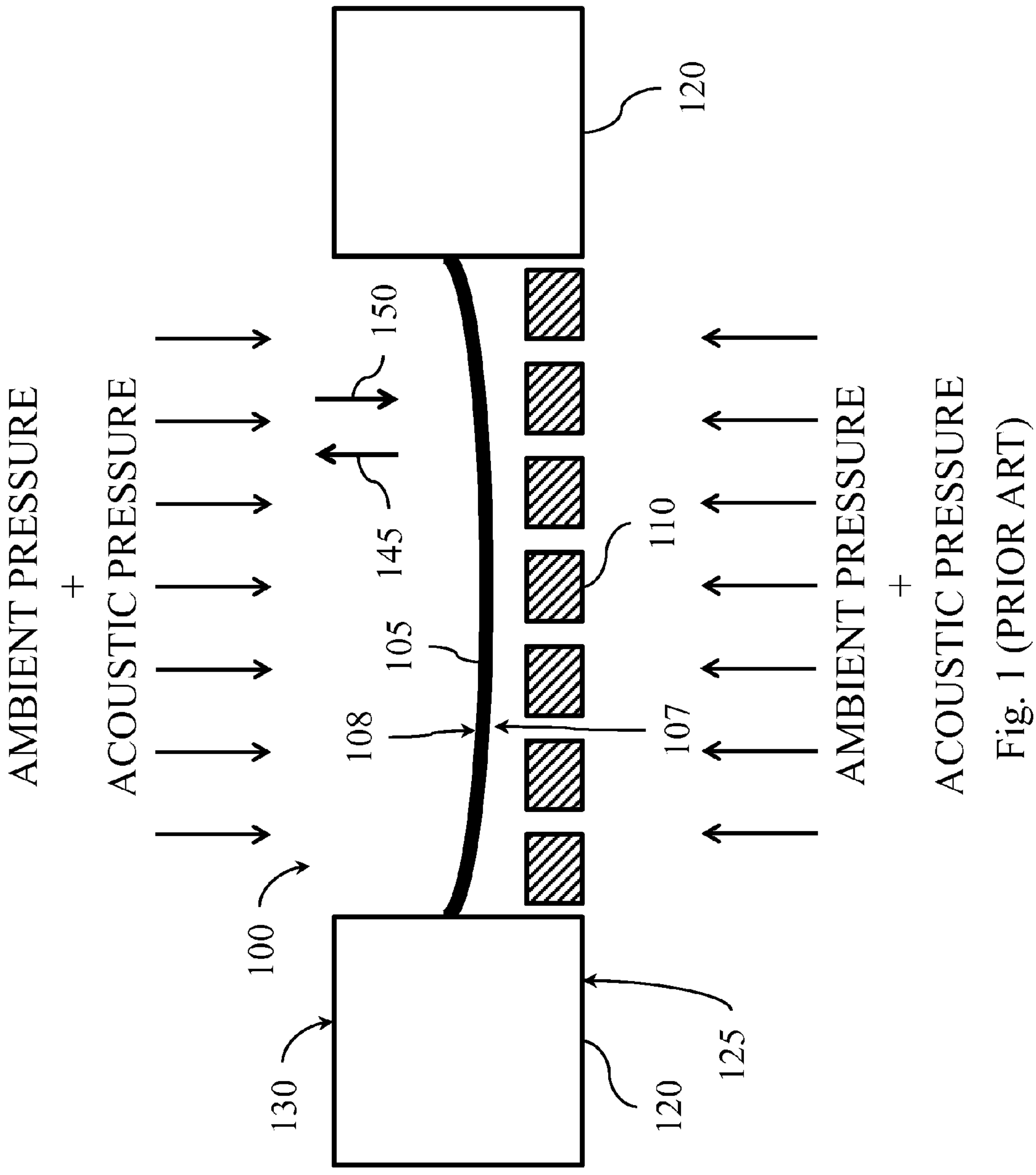
Fig. 1 (PRIOR ART)
FIG. 1 is a cross-sectional side view of a prior-art MEMS microphone.
Figure 2:
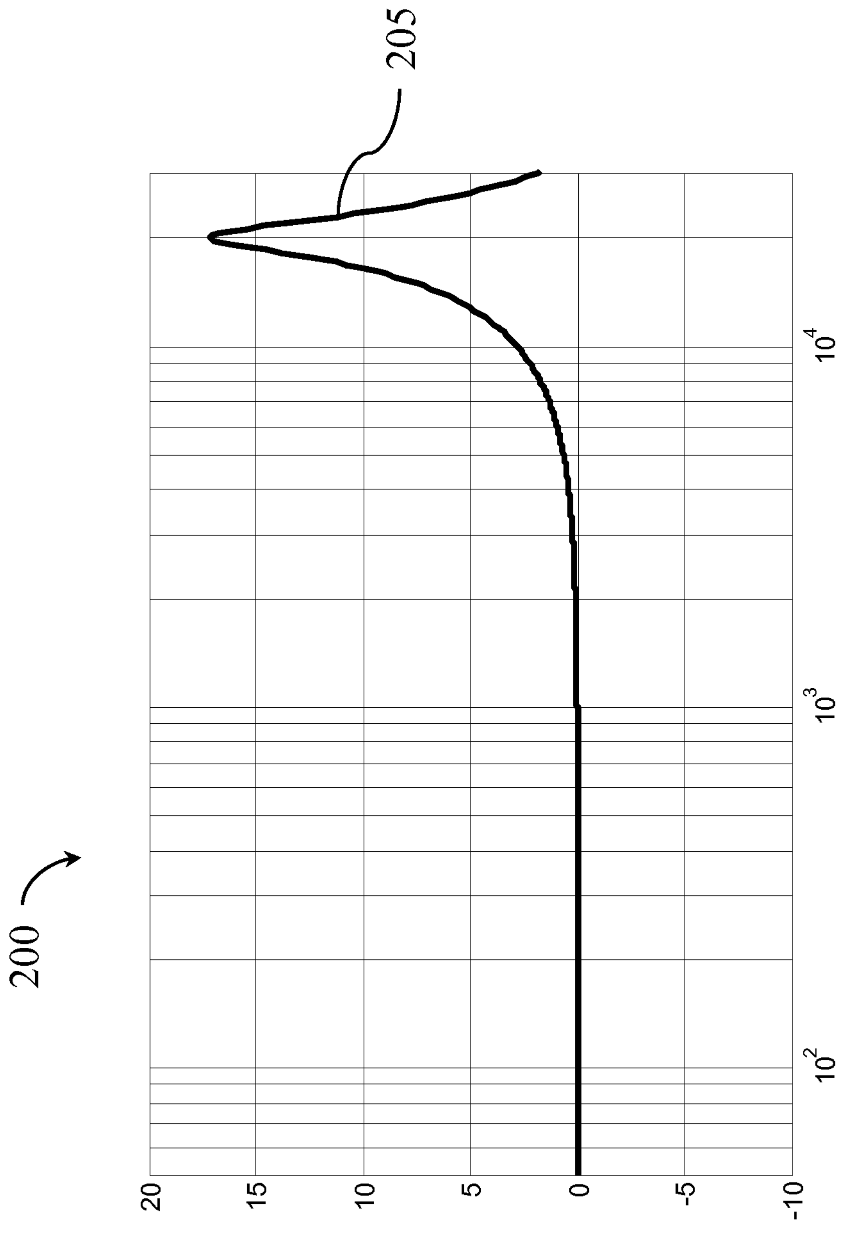
Fig. 2 (PRIOR ART)
FIG. 2 is a graph of a frequency response of a prior-art MEMS microphone, such as illustrated in FIG. 1.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Also, it is to be understood that the phraseology and terminology used herein is for the purpose of description and should not be regarded as limiting. The use of "including," "comprising" or "having" and variations thereof herein is meant to encompass the items listed thereafter and equivalents thereof as well as additional items. The terms "mounted," "connected" and "coupled" are used broadly and encompass both direct and indirect mounting, connecting and coupling. Further, "connected" and "coupled" are not restricted to physical or mechanical connections or couplings, and can include electrical connections or couplings, whether direct or indirect.

It should also be noted that a plurality of different structural components may be utilized to implement the invention. Furthermore, and as described in subsequent paragraphs, the specific configurations illustrated in the drawings are intended to exemplify embodiments of the invention. Alternative configurations are possible.

Figure 3:
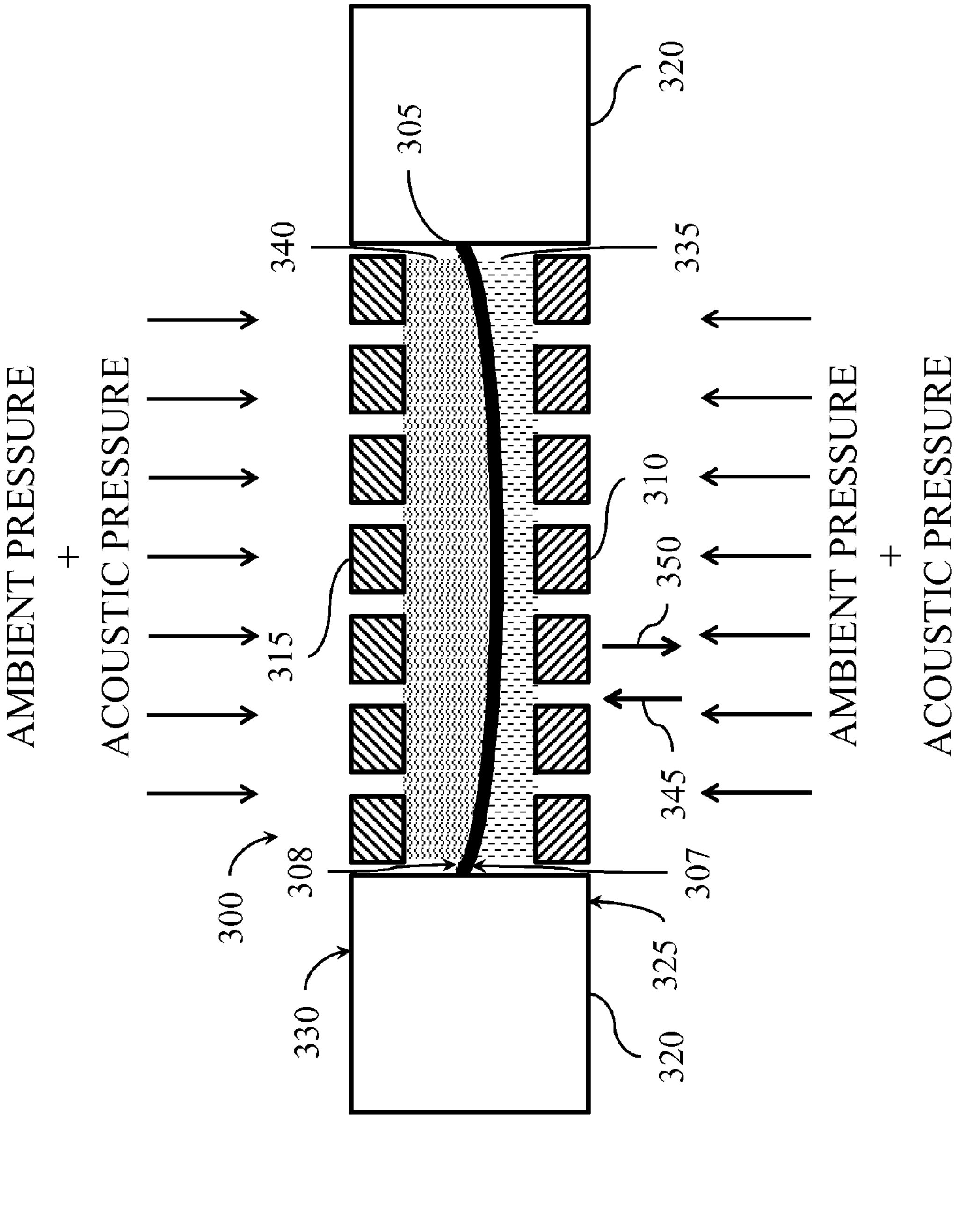
FIG. 3 is a cross-sectional side view of a MEMS microphone.

In some implementations, a MEMS microphone 300 includes, among other components, a movable electrode 305 having a first side 307 and a second side 308, a stationary electrode 310, a driven electrode 315, and a barrier 320, as illustrated in FIG. 3. The stationary electrode 310 is positioned on the first side 307 of the movable electrode 305. The driven electrode is positioned on the second side 308 of the movable electrode 305. The barrier 320 isolates a first side 325 and a second side 330 of the MEMS microphone 300.

In some implementations, the movable electrode 305 is kept at a reference voltage and a bias voltage is applied to the stationary electrode 310 to generate an electric sense field 335 between the movable electrode 305 and the stationary electrode 310. In other implementations, the stationary electrode 310 is kept at a reference voltage and a bias voltage is applied to the movable electrode 305 to generate the electric sense field 335 between the movable electrode 305 and the stationary electrode 310. In some implementations, the reference voltage is a ground reference voltage (i.e., approximately 0 Volts). In other implementations, the reference voltage is a non-zero voltage. The electric sense field 335 is illustrated in FIG. 3 as a plurality of vertical dashes. Acoustic pressures acting on the first side 307 and the second side 308 of the movable electrode 305 cause deflection of the movable electrode 305 in the directions of arrow 345 and 350. The deflection of the movable electrode 305 modulates the electric sense field 335 between the movable electrode 305 and the stationary electrode 310. A voltage difference between the movable electrode 305 and the stationary electrode 310 varies based on the electric sense field 335.

The driven electrode 315 is configured to receive a control signal and generate an electric drive field 340 between the driven electrode 315 and the movable electrode 305. The electric drive field 340 is illustrated in FIG. 3 as a plurality of horizontal wave lines. In some implementations, the control signal is a bias voltage. The electric drive field 340 alters an electrical parameter of the MEMS microphone 300. For example, the electric drive field 340 exerts a force which attracts the movable electrode 305 toward the driven electrode 315. The attractive force counteracts and modulates the deflection of the movable electrode 305 caused by acoustic pressures acting on the movable electrode 305.

Parameters of the MEMS microphone 300 include, for example, a system (i.e., effective) stiffness of the movable electrode 305, the Q factor (i.e., quality factor) of the MEMS microphone 300, and mode shapes of the movable electrode 305. The system stiffness is also referred as the system mass. The system stiffness of the movable electrode 305 defines a distance that the movable electrode 305 will deflect per unit of applied pressure (e.g., acoustic, ambient, etc.). The system stiffness of the movable electrode 305 is defined by mechanical parameters and electrical parameters of the MEMS microphone 300. The mechanical parameters include, among other parameters, the physical thickness and size of the movable electrode 305. For example, acoustic pressures will cause a greater deflection while acting on a thinner movable electrode then it will while acting on a thicker movable electrode. The electrical parameters include, among other parameters, attraction forces caused by electric fields (e.g., sense and drive) generated around the movable electrode 305.

Figure 4:
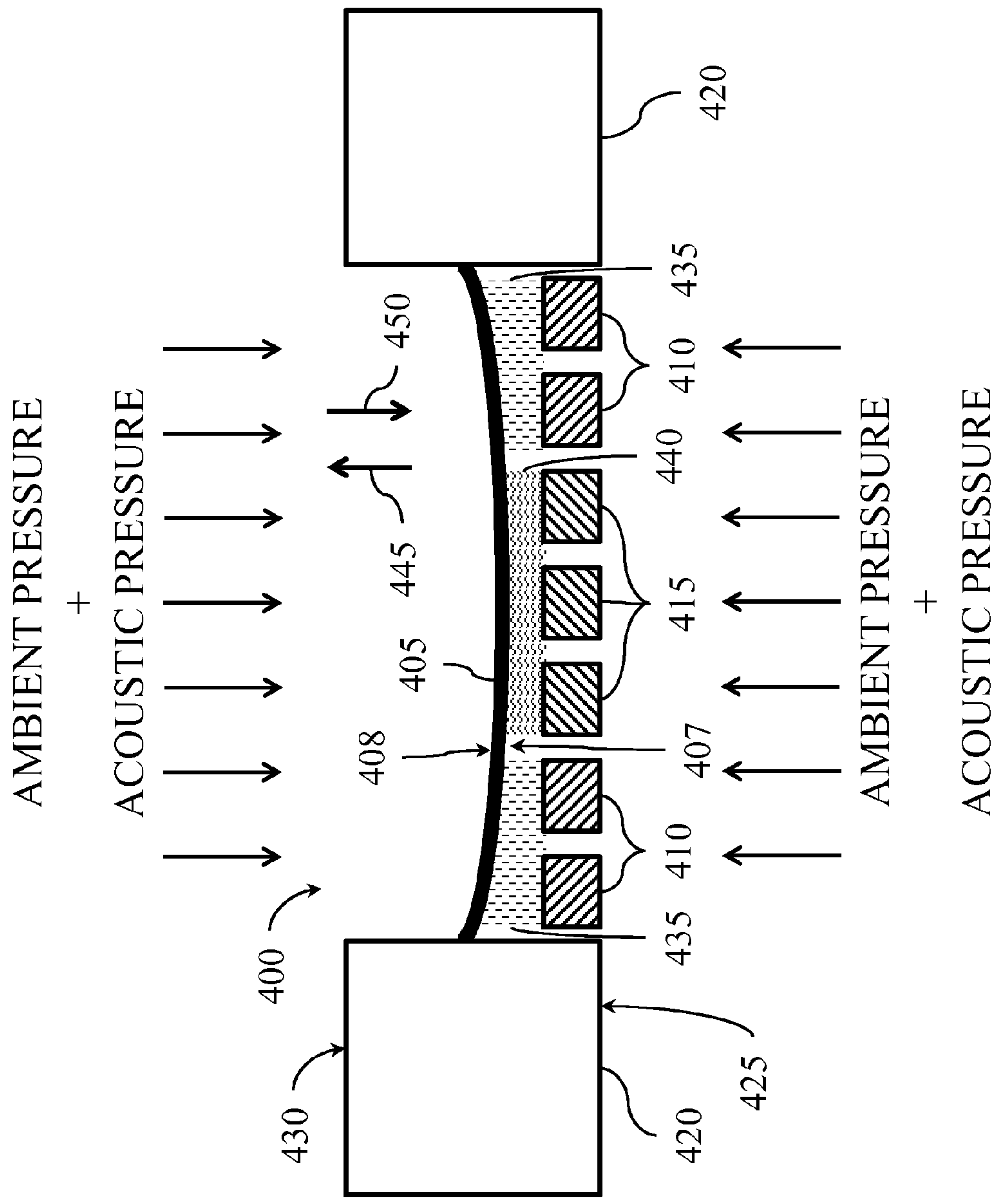
FIG. 4 is a cross-sectional side view of a MEMS microphone.

In some implementations, a MEMS microphone 400 includes, among other components, a movable electrode 405 having a first side 407 and a second side 408, a stationary electrode 410, a driven electrode 415, and a barrier 420, as illustrated in FIG. 4. The stationary electrode 410 and the driven electrode 415 are positioned on the first side 407 of the movable electrode 405. In some implementations, the stationary electrode 410 is positioned coplanar to the driven electrode 415, as illustrated in FIG. 4. In other implementations, the stationary electrode 410 is not positioned coplanar to the driven electrode 415. The barrier 420 isolates a first side 425 and a second side 430 of the MEMS microphone 400.

In some implementations, the movable electrode 405 is kept at a reference voltage and a bias voltage is applied to the stationary electrode 410 to generate an electric sense field 435 between the movable electrode 405 and the stationary electrode 410. In other implementations, the stationary electrode 410 is kept at a reference voltage and a bias voltage is applied to the movable electrode 405 to generate the electric sense field 435 between the movable electrode 405 and the stationary electrode 410. In some implementations, the reference voltage is a ground reference voltage (i.e., approximately 0 Volts). In other implementations, the reference voltage is a non-zero voltage. Acoustic pressures acting on the first side 407 and the second side 408 of the movable electrode 405 cause deflection of the movable electrode 405 in the directions of arrow 445 and 450. The deflection of the movable electrode 405 modulates the electric sense field 435 between the movable electrode 405 and the stationary electrode 410. A voltage difference between the movable electrode 405 and the stationary electrode 410 varies based on this electric sense field 435.

The driven electrode 415 is configured to receive a control signal and generate an electric drive field 440 between the driven electrode 415 and the movable electrode 405. In some implementations, the control signal is a bias voltage. The electric drive field 440 alters an electrical parameter of the MEMS microphone 400. Unlike the electric drive field 340 in FIG. 3 which modulates the deflection of the movable electrode 305, the electric drive field 440 in FIG. 4 modulates the electric sense field 435 between the movable electrode 405 and the stationary electrode 410. The electric drive field 440 alters the amount of voltage difference that a given deflection of the movable electrode 405 will cause.

Figure 5:
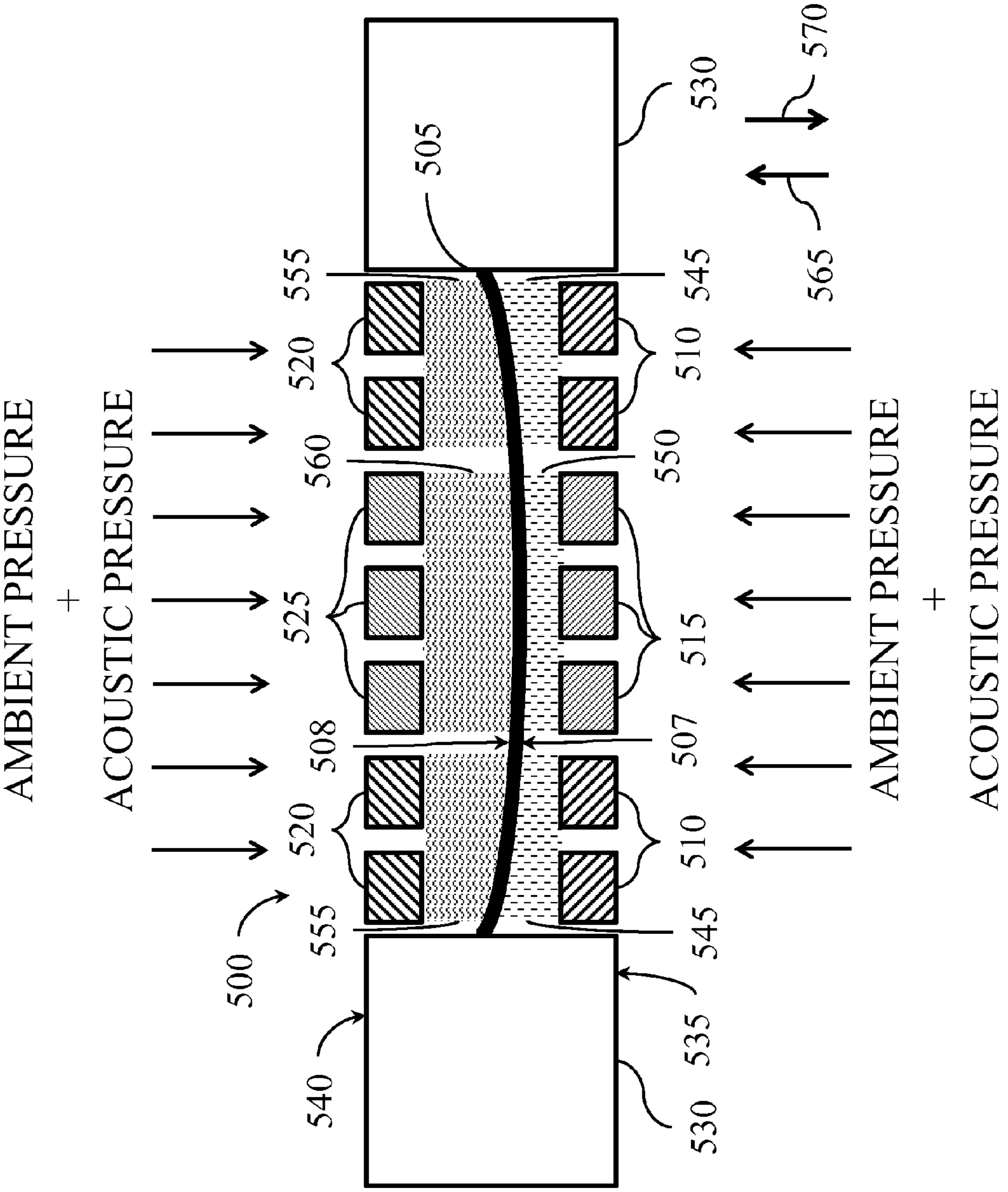
FIG. 5 is a cross-sectional side view of a MEMS microphone.

In some implementations, a MEMS microphone 500 includes, among other components, a movable electrode 505 having a first side 507 and a second side 508, a first stationary electrode 510, a second stationary electrode 515, a first driven electrode 520, a second driven electrode 525, and a barrier 530, as illustrated in FIG. 5. The first stationary electrode 510 and the second stationary electrode 515 are positioned on the first side 507 of the movable electrode 505. In some implementations, the first stationary electrode 510 is positioned coplanar to the second stationary electrode 515, as illustrated in FIG. 5. In other implementations, the first stationary electrode 510 is not positioned coplanar to the second stationary electrode 515. The first driven electrode 520 and the second driven electrode 525 are positioned on the second side 508 of the movable electrode 505. In some implementations, the first driven electrode 520 is positioned coplanar to the second driven electrode 525, as illustrated in FIG. 5. In other implementations, the first driven electrode 520 is not positioned coplanar to the second driven electrode 525. The barrier 530 isolates a first side 535 and a second side 540 of the MEMS microphone 500.

In some implementations, the movable electrode 505 is kept at a reference voltage, a first bias voltage is applied to the first stationary electrode 510 to generate a first electric sense field 545 between the movable electrode 505 and the first stationary electrode 510, and a second bias voltage is applied to the second stationary electrode 515 to generate a second electric sense field 550 between the movable electrode 505 and the second stationary electrode 515. In other implementations, the first stationary electrode 510 and the second stationary electrode 515 are kept at a reference voltage, and a bias voltage is applied to the movable electrode 505 to generate the first electric sense field 545 between the movable electrode 505 and the first stationary electrode 510 and the second electric sense field 550 between the movable electrode 505 and the second stationary electrode 515. In some implementations, the reference voltage is a ground reference voltage (i.e., approximately 0 Volts). In other implementations, the reference voltage is a non-zero voltage. Acoustic pressures acting on the first side 507 and the second side 508 of the movable electrode 505 cause deflection of the movable electrode 505 in the directions of arrow 565 and 570. The deflection of the movable electrode 505 modulates the first electric sense field 545 between the movable electrode 505 and the first stationary electrode 510. A first voltage difference between the movable electrode 505 and the first stationary electrode 510 varies based on the first electric sense field 545. The deflection of the movable electrode 505 also modulates the second electric sense field 550 between the movable electrode 505 and the second stationary electrode 515. A second voltage difference between the movable electrode 505 and the second stationary electrode 515 varies based on the second electric sense field 550.

The first driven electrode 520 is configured to receive a first control signal and generate a first electric drive field 555 between the first driven electrode 520 and the movable electrode 505. The first electric drive field 555 alters an electrical parameter of the MEMS microphone 500. The second driven electrode 525 is configured to receive a second control signal and generate a second electric drive field 560 between the second driven electrode 525 and the movable electrode 505. The second electric drive field 560 also alters an electrical parameter of the MEMS microphone 500. In some implementations, the first control signal and the second control signal are bias voltages.

Figure 6:
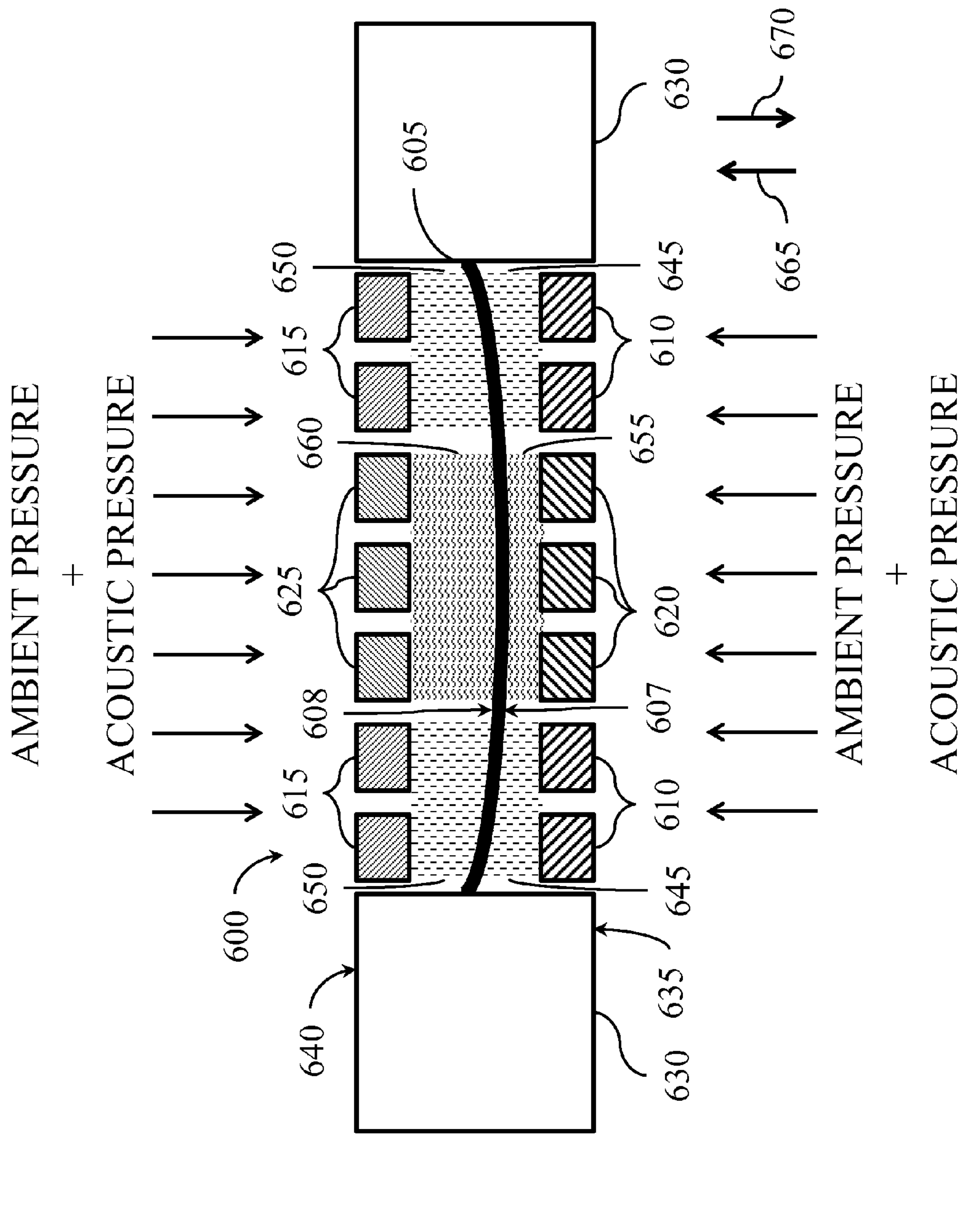
FIG. 6 is a cross-sectional side view of a MEMS microphone.

In some implementations, a MEMS microphone 600 includes, among other components, a movable electrode 605 having a first side 607 and a second side 608, a first stationary electrode 610, a second stationary electrode 615, a first driven electrode 620, a second driven electrode 625, and a barrier 630, as illustrated in FIG. 6. The first stationary electrode 610 and the first driven electrode 620 are positioned on the first side 607 of the movable electrode 605. In some implementations, the first stationary electrode 610 is positioned coplanar to the first driven electrode 620, as illustrated in FIG. 6. In other implementations, the first stationary electrode 610 is not positioned coplanar to the first driven electrode 620. The second stationary electrode 615 and the second driven electrode 625 are positioned on the second side 608 of the movable electrode 605. In some implementations, the second stationary electrode 615 is positioned coplanar to the second driven electrode 625, as illustrated in FIG. 6. In other implementations, the second stationary electrode 615 is not positioned coplanar to the second driven electrode 625. The barrier 630 isolates a first side 635 and a second side 640 of the MEMS microphone 600.

In some implementations, the movable electrode 605 is kept at a reference voltage, a first bias voltage is applied to the first stationary electrode 610 to generate a first electric sense field 645 between the movable electrode 605 and the first stationary electrode 610, and a second bias voltage is applied to the second stationary electrode 615 to generate a second electric sense field 650 between the movable electrode 605 and the second stationary electrode 615. In other implementations, the first stationary electrode 610 and the second stationary electrode 615 are kept at a reference voltage, and a bias voltage is applied to the movable electrode 605 to generate the first electric sense field 645 between the movable electrode 605 and the first stationary electrode 610 and the second electric sense field 650 between the movable electrode 605 and the second stationary electrode 615. In some implementations, the reference voltage is a ground reference voltage (i.e., approximately 0 Volts). In other implementations, the reference voltage is a non-zero voltage. Acoustic pressures acting on the first side 607 and the second side 608 of the movable electrode 605 cause deflection of the movable electrode 605 in the directions of arrow 665 and 670. The deflection of the movable electrode 605 modulates the first electric sense field 645 between the movable electrode 605 and the first stationary electrode 610. A first voltage difference between the movable electrode 605 and the first stationary electrode 610 varies based on the first electric sense field 645. The deflection of the movable electrode 605 also modulates the second electric sense field 650 between the movable electrode 605 and the second stationary electrode 615. A second voltage difference between the movable electrode 605 and the second stationary electrode 615 varies based on the second electric sense field 650.

The first driven electrode 620 is configured to receive a first control signal and generate a first electric drive field 655 between the first driven electrode 620 and the movable electrode 605. The first electric drive field 655 alters an electrical parameter of the MEMS microphone 600. The second driven electrode 625 is configured to receive a second control signal and generate a second electric drive field 660 between the second driven electrode 625 and the movable electrode 605. The second electric drive field 660 also alters an electrical parameter of the MEMS microphone 600. In some implementations, the first control signal and the second control signal are bias voltages.

Figure 7:
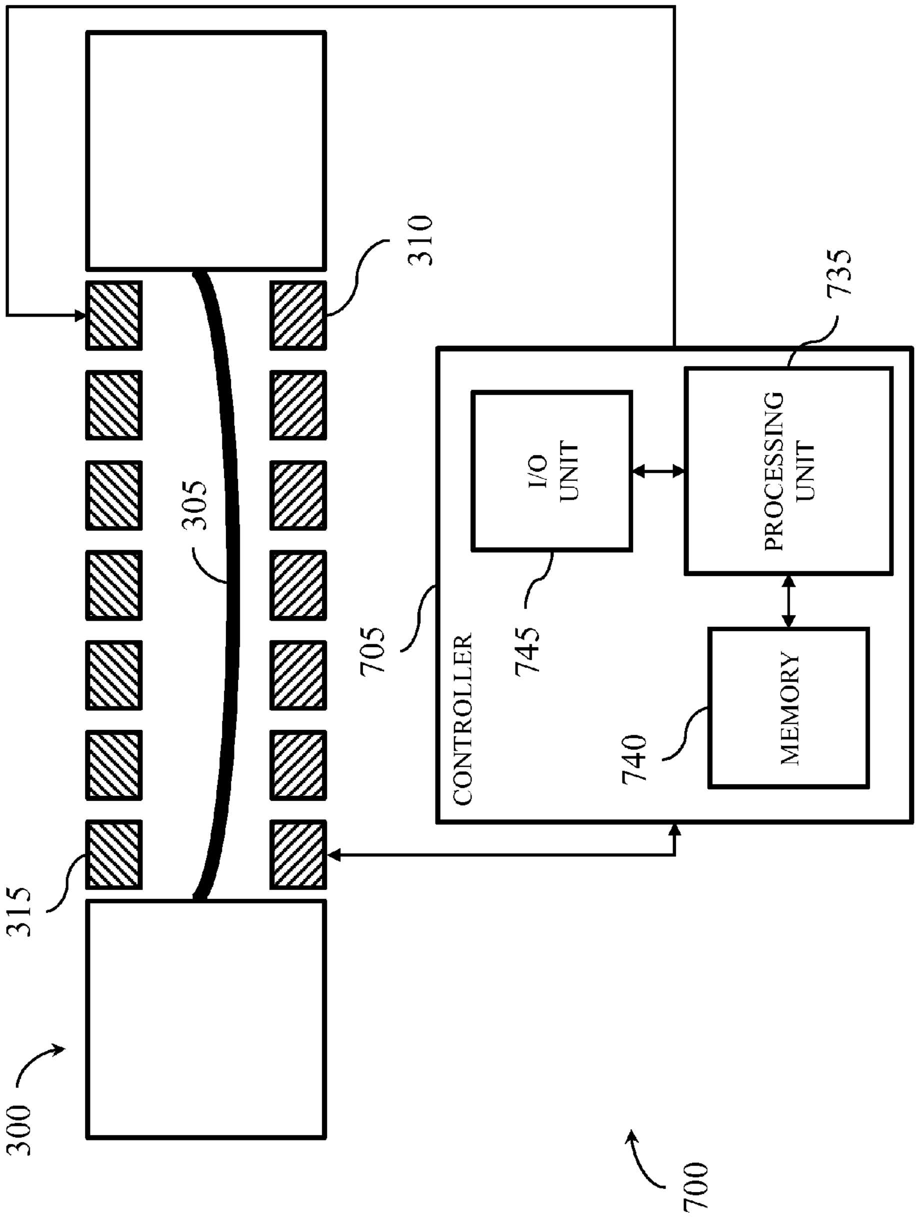
FIG. 7 is a block diagram of a microphone system including the MEMS microphone of FIG. 3.

In some implementations, a microphone system 700 includes, among other components, a MEMS microphone 300 and a controller 705, as illustrated in FIG. 7.

The controller 705 includes combinations of software and hardware that are operable to, among other things, produce processed signals to drive the driven electrode 315. In one implementation, the controller 705 includes a printed circuit board ("PCB") that is populated with a plurality of electrical and electronic components that provide, power, operational control, and protection to the microphone system 700. In some implementations, the PCB includes, for example, a processing unit 735 (e.g., a microprocessor, a microcontroller, or another suitable programmable device), a memory 740, and a bus. The bus connects various components of the PCB including the memory 740 to the processing unit 735. The memory 740 includes, for example, a read-only memory ("ROM"), a random access memory ("RAM"), an electrically erasable programmable read-only memory ("EEPROM"), a flash memory, a hard disk, or another suitable magnetic, optical, physical, or electronic memory device. The processing unit 735 is connected to the memory 740 and executes software that is capable of being stored in the RAM (e.g., during execution), the ROM (e.g., on a generally permanent basis), or another non-transitory computer readable medium such as another memory or a disc. Additionally or alternatively, the memory 740 is included in the processing unit 735. The controller 705 also includes an input/output ("I/O") unit 745 that includes routines for transferring information and electric signals between components within the controller 705 and other components of the microphone system 700 or components external to the microphone system 700.

Software included in some implementations of the microphone system 700 is stored in the memory 740 of the controller 705. The software includes, for example, firmware, one or more applications, program data, one or more program modules, and other executable instructions. The controller 705 is configured to retrieve from memory 740 and execute, among other components, instructions related to the control processes and methods described below. In some implementations, the controller 705 or external device includes additional, fewer, or different components.

The PCB also includes, among other components, a plurality of additional passive and active components such as resistors, capacitors, inductors, integrated circuits, and amplifiers. These components are arranged and connected to provide a plurality of electrical functions to the PCB including, among other things, filtering, signal conditioning, or voltage regulation. For descriptive purposes, the PCB and the electrical components populated on the PCB are collectively referred to as the controller 705.

The controller 705 is coupled to the stationary electrode 310. The controller 705 is also coupled to the driven electrode 315 and is configured to generate a control signal. In some implementations, the control signal is a bias voltage. In some implementations, the controller 705 is configured to determine a voltage difference between the movable electrode 305 and the stationary electrode 310 based at least in part on a bias voltage that is applied to the stationary electrode 310 by the controller 705 and a bias voltage that is applied to the driven electrode 315 by the controller 705. In other implementations, the controller 705 is configured to determine the voltage difference between the movable electrode 305 and the stationary electrode 310 based at least in part on a bias voltage that is applied to the movable electrode 305 by the controller 705 and the bias voltage that is applied to the driven electrode 315 by the controller 705.

In some implementations, the controller 705 is configured to generate the control signal based on the voltage difference between the movable electrode 305 and the stationary electrode 310. In some implementations, a second or external controller (not shown) is coupled to stationary electrode 310 and is configured to apply the bias voltage. In other implementations, a second or external controller (not shown) is coupled to the movable electrode 305 and is configured to apply the bias voltage.

In some implementations, the bias voltage applied to the stationary electrode 310 and the bias voltage applied to the driven electrode 315 are on opposite sides of the reference voltage that the movable electrode 305 is kept at. For example, if the movable electrode 305 is held at a reference voltage of 5 Volts, the bias voltage applied to the stationary electrode 310 can be 2 Volts and the bias voltage applied to the driven electrode 315 can be 8 Volts.

Figure 8:
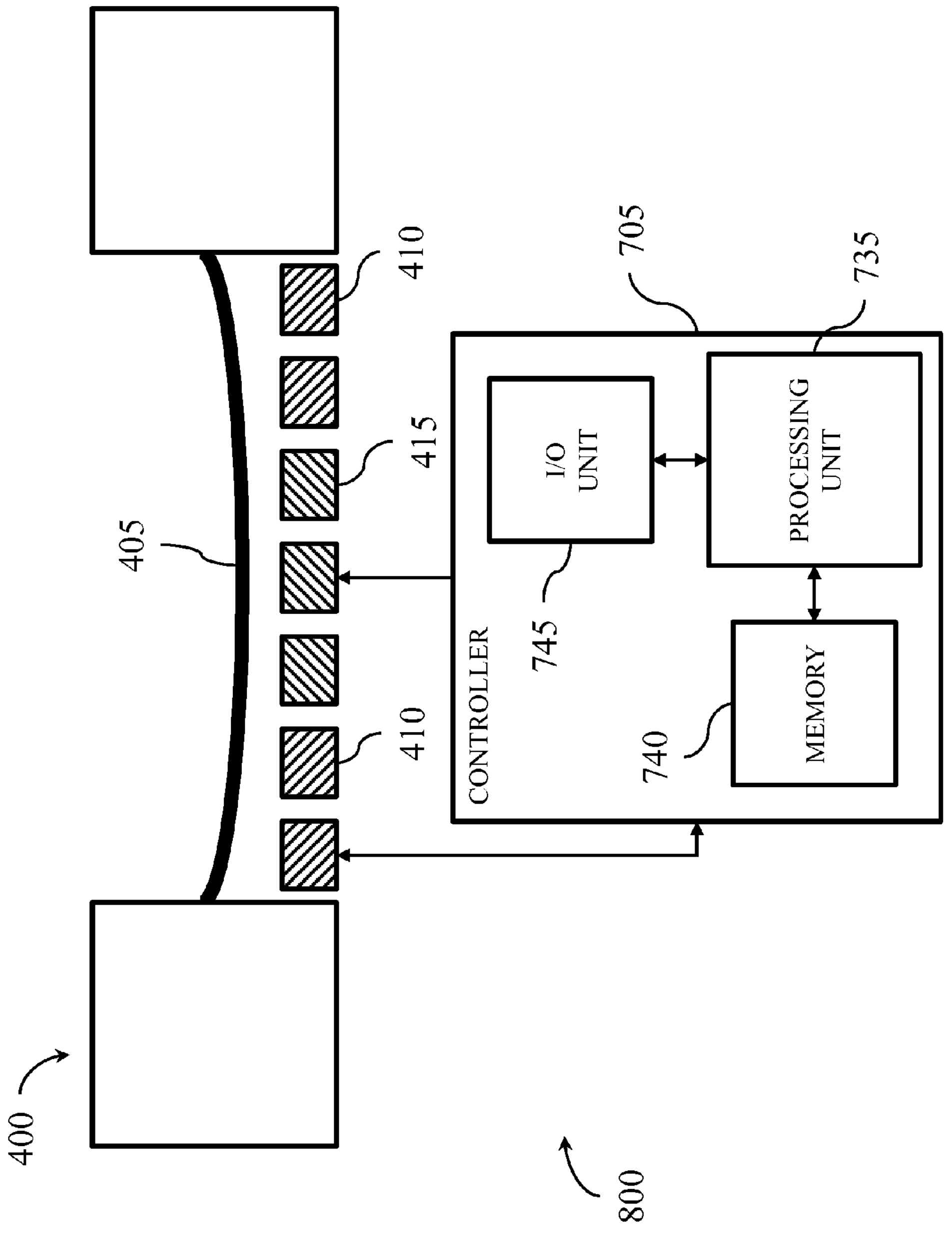
FIG. 8 is a block diagram of a microphone system including the MEMS microphone of FIG. 4.

In some implementations, a microphone system 800 includes, among other components, a MEMS microphone 400 and a controller 705, as illustrated in FIG. 8. The controller 705 is coupled to the stationary electrode 410. The controller 705 is also coupled to the driven electrode 415 and is configured to generate a control signal. In some implementations, the controller 705 is configured to determine a voltage difference between the movable electrode 405 and the stationary electrode 410 based at least in part on a bias voltage that is applied to the stationary electrode 410 by the controller 705 and a bias voltage that is applied to the driven electrode 415 by the controller 705. In other implementations, the controller 705 is configured to determine the voltage difference between the movable electrode 405 and the stationary electrode 410 based at least in part on a bias voltage that is applied to the movable electrode 405 by the controller 705 and the bias voltage that is applied to the driven electrode 415 by the controller 705. In some implementations, the controller 705 is configured to generate the control signal based on the voltage difference between the movable electrode 405 and the stationary electrode 410.

Figure 9:
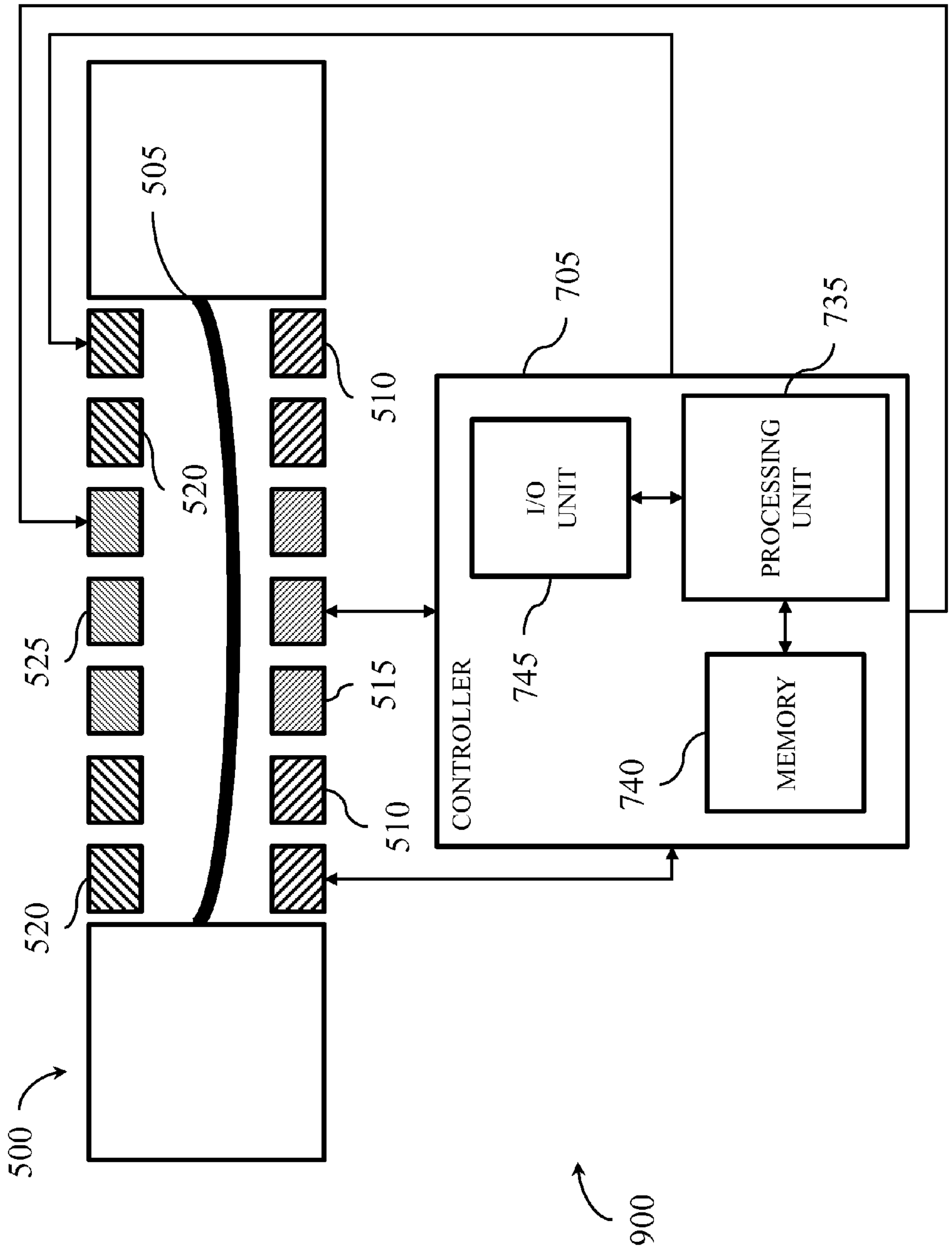
FIG. 9 is a block diagram of a microphone system including the MEMS microphone of FIG. 5.

In some implementations, a microphone system 900 includes, among other components, a MEMS microphone 500 and a controller 705, as illustrated in FIG. 9. The controller 705 is coupled to the first stationary electrode 510 and the second stationary electrode 515. The controller 705 is also coupled to the first driven electrode 520 and is configured to generate a first control signal. The controller 705 is also coupled to the second driven electrode 525 and is configured to generate a second control signal. In some implementations, the first control signal and the second control signal are bias voltages.

In some implementations, the controller 705 is configured to determine a first voltage difference between the movable electrode 505 and the first stationary electrode 510 based at least in part on a bias voltage that is applied to the first stationary electrode 510 by the controller 705 and a bias voltage that is applied to the first driven electrode 520 by the controller 705. In other implementations, the controller 705 is configured to determine the first voltage difference between the movable electrode 505 and the first stationary electrode 510 based at least in part on a bias voltage that is applied to the movable electrode 505 by the controller 705 and the bias voltage that is applied to the first driven electrode 520 by the controller 705.

In some implementations, the controller 705 is configured to determine a second voltage difference between the movable electrode 505 and the second stationary electrode 515 based at least in part on a bias voltage that is applied to the second stationary electrode 515 by the controller 705 and a bias voltage that is applied to the second driven electrode 525 by the controller 705. In other implementations, the controller 705 is configured to determine the second voltage difference between the movable electrode 505 and the second stationary electrode 515 based at least in part on a bias voltage that is applied to the movable electrode 505 by the controller 705 and a bias voltage that is applied to the second driven electrode 525 by the controller 705.

In some implementations, the controller 705 is configured to determine the first control signal based on the first voltage difference, and to determine the second control signal based on the second voltage difference. In other implementations, the controller 705 is configured to determine the first control signal based on the first voltage difference and the second voltage difference. In other implementations, the controller 705 is configured to determine the second control signal based on the first voltage difference and the second voltage difference.

Figure 10:
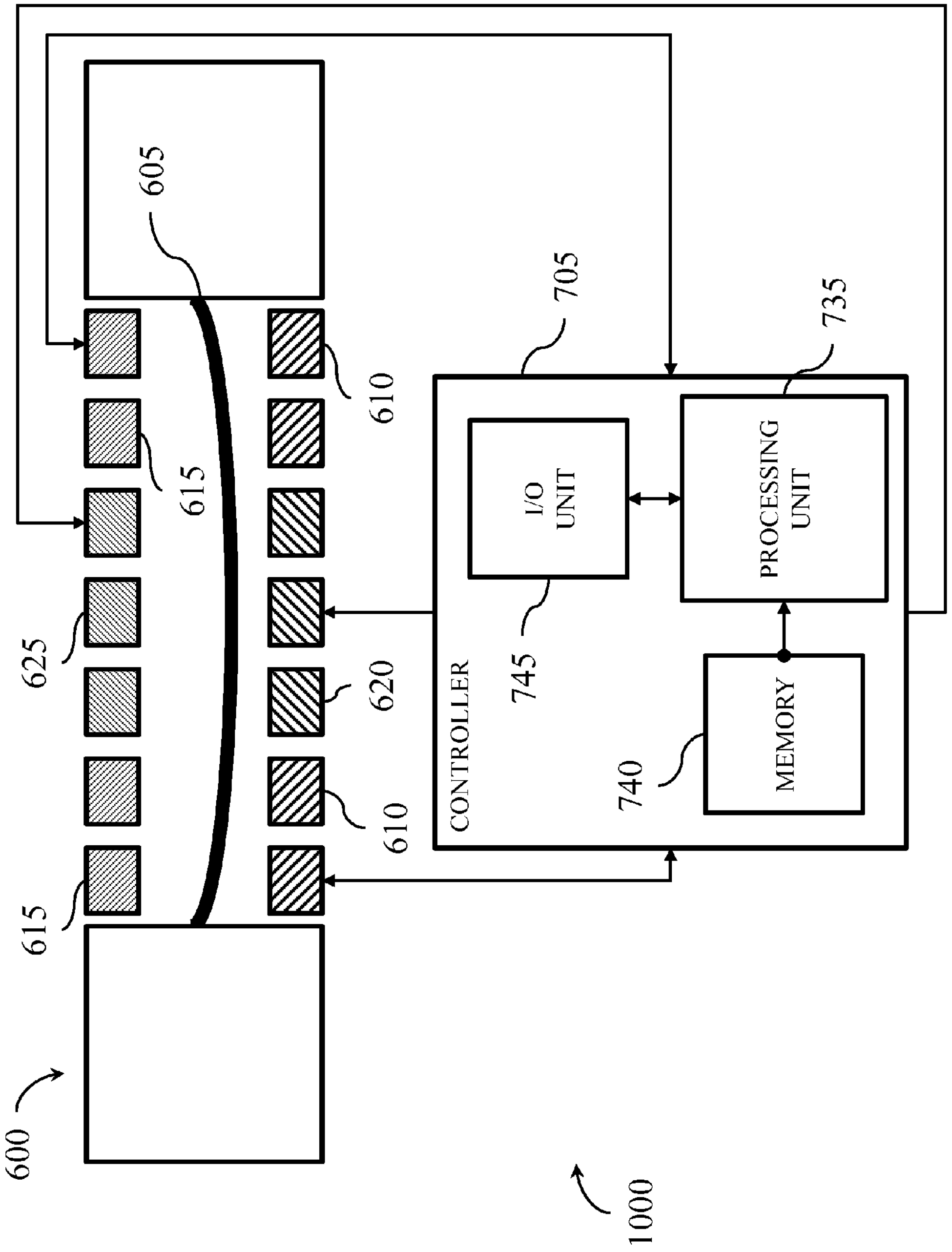
FIG. 10 is a block diagram of a microphone system including the MEMS microphone of FIG. 6.

In some implementations, a microphone system 1000 includes, among other components, a MEMS microphone 600 and a controller 705, as illustrated in FIG. 10. The controller 705 is coupled to the first stationary electrode 610 and the second stationary electrode 615. The controller 705 is also coupled to the first driven electrode 620 and is configured to generate a first control signal. The controller 705 is also coupled to the second driven electrode 625 and is configured to generate a second control signal. In some implementations, the first control signal and the second control signal are bias voltages.

In some implementations, the controller 705 is configured to determine a first voltage difference between the movable electrode 605 and the first stationary electrode 610 based at least in part on a bias voltage that is applied to the first stationary electrode 610 by the controller 705 and a bias voltage that is applied to the first driven electrode 620 by the controller 705. In other implementations, the controller 705 is configured to determine the first voltage difference between the movable electrode 605 and the first stationary electrode 610 based at least in part on a bias voltage that is applied to the movable electrode 605 by the controller 705 and the bias voltage that is applied to the first driven electrode 620 by the controller 705.

In some implementations, the controller 705 is configured to determine a second voltage difference between the movable electrode 605 and the second stationary electrode 615 based at least in part on a bias voltage that is applied to the second stationary electrode 615 by the controller 705 and a bias voltage that is applied to the second driven electrode 625 by the controller 705. In other implementations, the controller 705 is configured to determine the second voltage difference between the movable electrode 605 and the second stationary electrode 615 based at least in part on a bias voltage that is applied to the movable electrode 605 by the controller 705 and the bias voltage that is applied to the second driven electrode 625 by the controller 705.

In some implementations, the controller 705 is configured to determine the first control signal based on the first voltage difference, and to determine the second control signal based on the second voltage difference. In other implementations, the controller 705 is configured to determine the first control signal based on the first voltage difference and the second voltage difference. In other implementations, the controller 705 is configured to determine the second control signal based on the first voltage difference and the second voltage difference.

Figure 11:
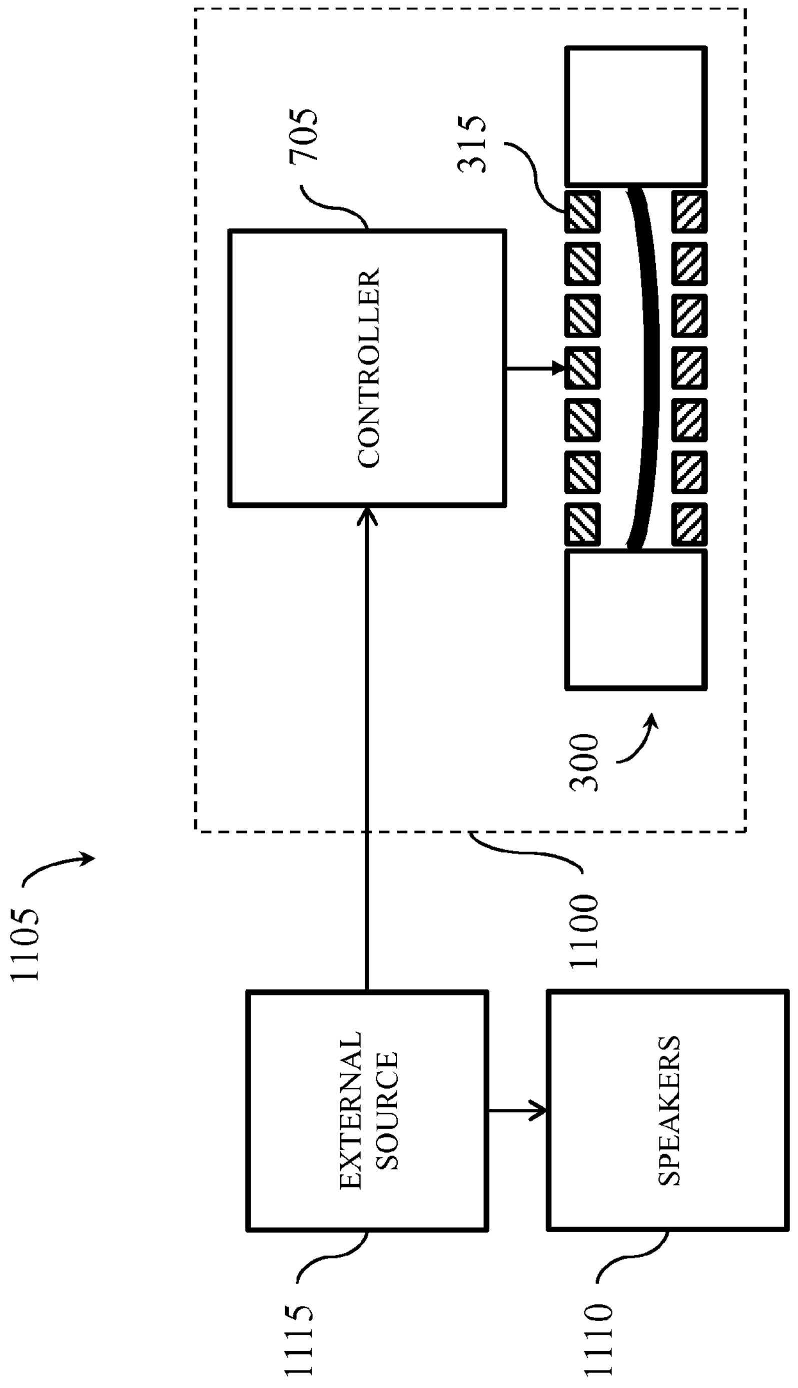
FIG. 11 is a block diagram of a control network including the microphone system of FIG. 7.

In some implementations, a microphone system 1100 is a component of a larger control network 1105 and the driven electrode 315 is used to cancel a known acoustic signal, as illustrated in FIG. 11. For example, if a set of speakers 1110 (e.g., from a television) are playing a signal from an external source 1115, the external output signal is already known and is in the form of a voltage signal. This signal can be used to directly cancel the acoustic signal if the microphone system 1100 is placed in close proximity to the set of speakers 1110. The controller 705 is coupled to the external source 1115 and is configured to receive the external output signal from the external source 1115. In some implementations, the controller 705 is configured to determine the control signal for the driven electrode 315 based on the external output signal from the external source 1115.

Figure 12:
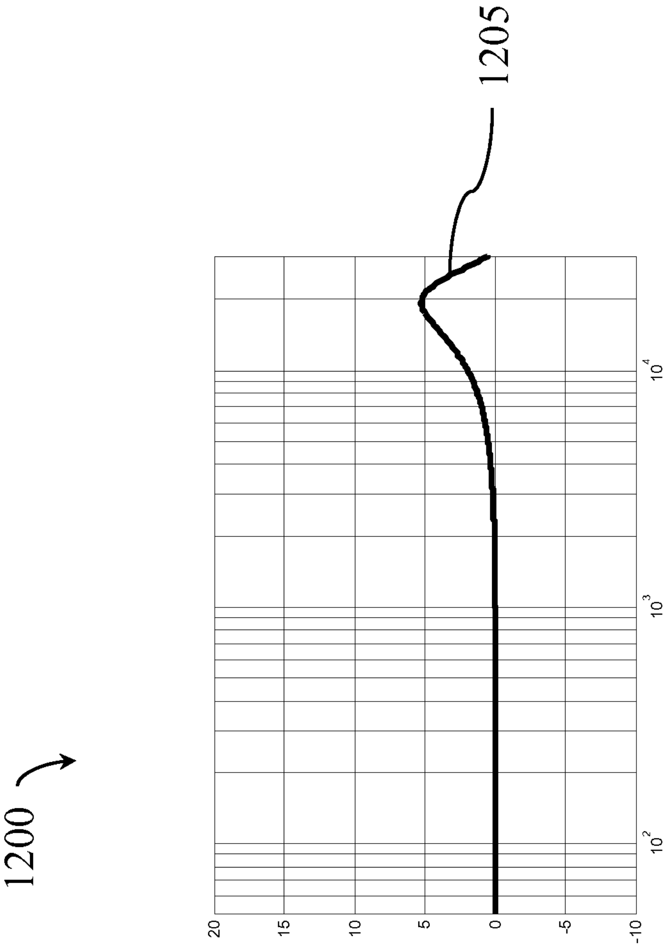
FIG. 12 is a graph of a frequency response of the MEMS microphones of FIGS. 3-6.
Figure 13:
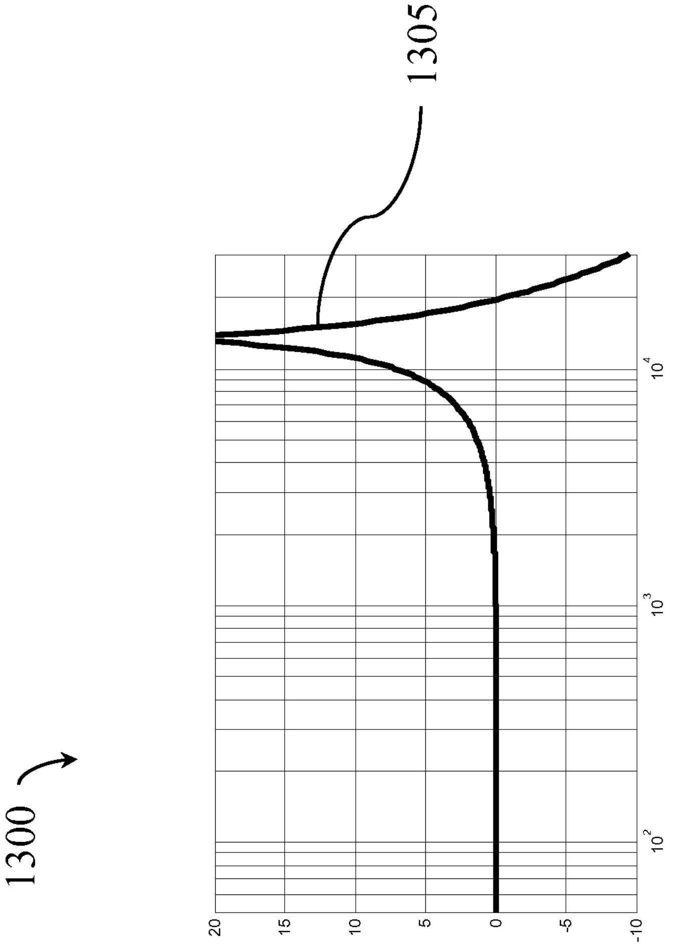
FIG. 13 is a graph of a frequency response of the MEMS microphones of FIGS. 3-6.
Figure 14:
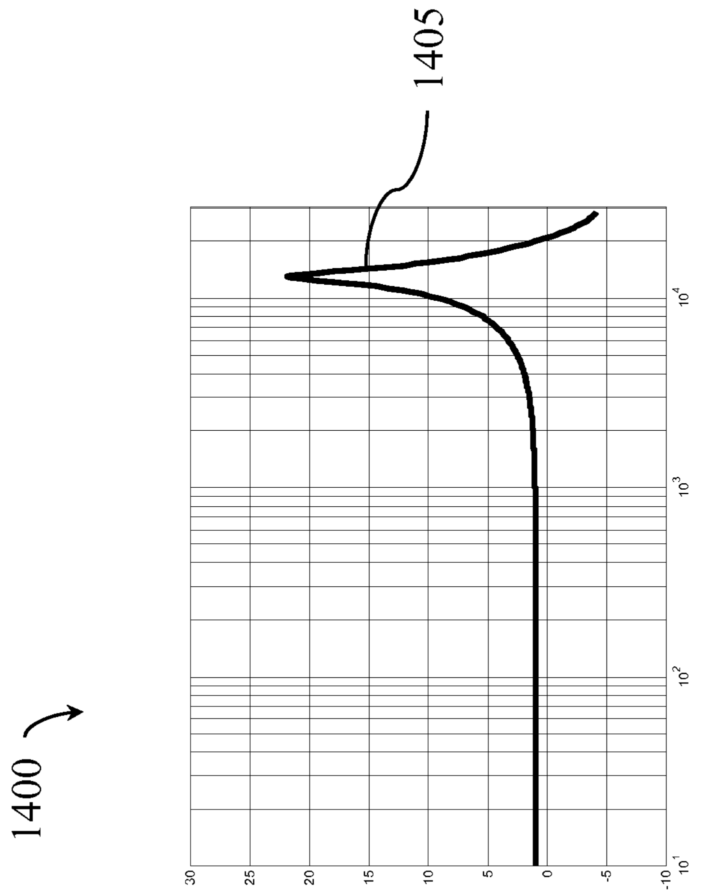
FIG. 14 is a graph of a frequency response of the MEMS microphones of FIGS. 3-6.
Figure 15:
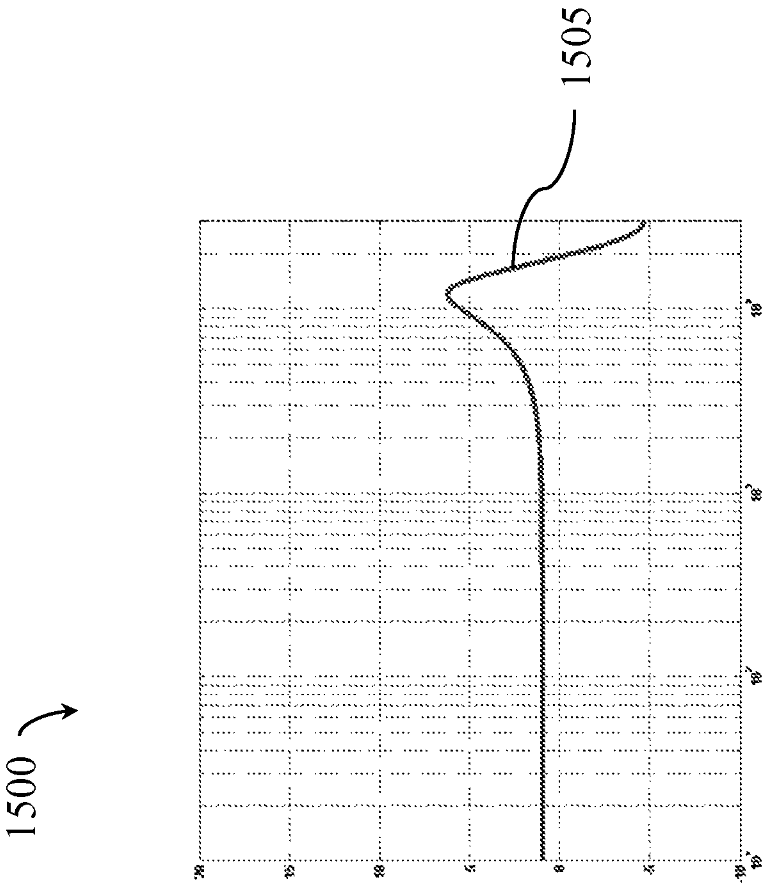
FIG. 15 is a graph of a frequency response of the MEMS microphones of FIGS. 3-6.

FIG. 12 is a graph 1200 of an exemplary frequency response 1205 of the MEMS microphones illustrated in FIGS. 3-6, using the driven electrode(s) to control damping of the peak. FIG. 13 is a graph 1300 of an exemplary frequency response 1305 of the MEMS microphones illustrated in FIGS. 3-6, using the driven electrode(s) to control the stiffness and/or mass of the resonance peak. FIG. 14 is a graph 1400 of an exemplary frequency response 1405 of the MEMS microphones illustrated in FIGS. 3-6, using the driven electrode(s) to control the stiffness to enhance sensitivity below resonance. FIG. 15 is a graph 1500 of an exemplary frequency response 1505 of the MEMS microphones illustrated in FIGS. 3-6, using the driven electrode(s) to control damping of the peak, the stiffness and/or mass of the resonance peak, and the stiffness to enhance sensitivity below resonance. In the graphs of FIGS. 12-15, the horizontal axis is frequency (in hertz) and the vertical axis is gain (in dB).

Figure 16A:
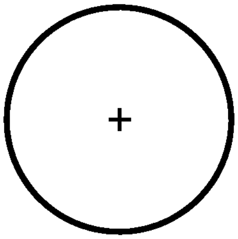
FIGS. 16A-C are cross-sectional top views of circular mode shapes for electrodes.
Figure 16B:
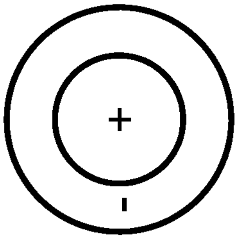
Figure 16C:
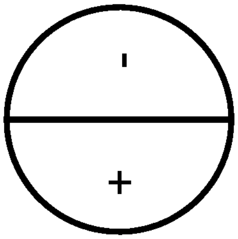
Figure 17A:
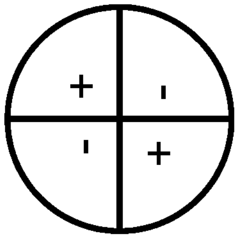
FIGS. 17A-C are cross-sectional top views of circular mode shapes for electrodes.
Figure 17B:
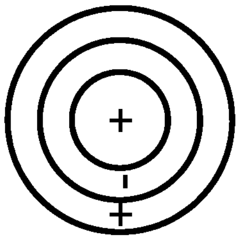
Figure 17C:
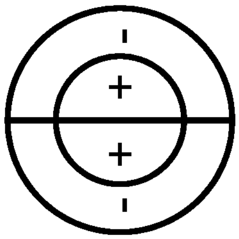
Figure 18B:
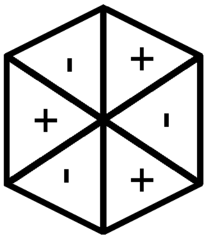
FIGS. 18A and 18B are cross-sectional top views of non-circular mode shapes for electrodes.
Figure 18A:
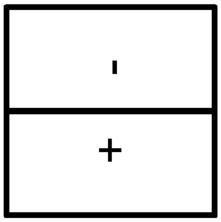

FIG. 16A illustrates a circular mode shape for electrodes, such as driven electrode 315 in FIG. 3. The sensitivity of such electrodes is limited to natural mode frequencies (i.e., approximately 8 KHz-120 KHz). Mode control enables increased microphone sensitivity across a greater range of frequencies. Mode control can be applied to higher order modes of MEMS microphones with multiple driven electrodes. Multiple driven electrodes are often referred to as split electrodes. FIG. 16B illustrates a circular mode shape for split electrodes, such as the first driven electrode 520 and the second driven electrode 525 in FIG. 5. FIG. 16C illustrates another circular mode shape for split electrodes. FIGS. 17A-17C illustrate examples of higher order circular mode shapes for split electrodes. Mode control is not limited to circular shaped electrodes. FIGS. 18A and 18B illustrate examples of higher order mode shapes for split electrodes that are not circular.

Thus, the invention provides, among other things, a microphone system with active drive of a movable electrode in a MEMS microphone. Various features and advantages of the invention are set forth in the following claims.

What is claimed is:

1. A microphone system, the microphone system comprising:

a MEMS microphone, the MEMS microphone including
  a movable electrode having a first side and a second side opposite the first side, the movable electrode configured such that acoustic pressures acting on the first side and the second side of movable electrode cause movement of the movable electrode,
  a stationary electrode positioned on the first side of the movable electrode, and
  a driven electrode positioned on the first side of the movable electrode, the driven electrode configured to receive a control signal and alter a parameter of the MEMS microphone based on the control signal; and
a controller coupled to the stationary electrode and the driven electrode, the controller configured to
  determine a voltage difference between the movable electrode and the stationary electrode, and
  generate the control signal based on the voltage difference.

2. The microphone system according to claim 1, wherein the parameter of the MEMS microphone includes at least one parameter selected from a group consisting of a system stiffness, a system mass, a quality factor, and a mode shape.

3. The microphone system according to claim 1, wherein the controller is further configured to receive an external output signal from an external source and generate the control signal based on the external output signal.

4. The microphone system according to claim 1, wherein the MEMS microphone further includes a second stationary electrode coupled to the controller and positioned on the second side of the movable electrode, and
a second driven electrode coupled to the controller and positioned on the second side of the movable electrode, the second driven electrode configured to receive a second control signal.

5. The microphone system of claim 4, wherein the controller is further configured to determine a second voltage difference between the movable electrode and the second stationary electrode and alter the parameter of the MEMS microphone based on the second control signal.

6. The microphone system according to claim 5, wherein the controller is further configured to generate the second control signal based on the second voltage difference.

7. The microphone system according to claim 6, wherein the controller is further configured to generate the control signal based on the second voltage difference, and
generate the second control signal based on the voltage difference.

8. A method for controlling a parameter of a MEMS microphone, the MEMS microphone including a movable electrode having a first side and a second side opposite the first side, the movable electrode configured such that acoustic pressures acting on the first side and the second side of the movable electrode cause movement of the movable electrode, a first stationary electrode positioned on the first side of the movable electrode, a second stationary electrode positioned on the first side of the movable electrode, a first driven electrode positioned on the second side of the movable electrode, and a second driven electrode positioned on the second side of the movable electrode, the method comprising:

determining, by a controller coupled to the stationary electrode, a voltage difference between the movable electrode and the first stationary electrode;
generating, by the controller, a control signal based on the voltage difference;
receiving, by the first driven electrode coupled to the controller, the control signal; and
altering, by the first driven electrode, the parameter of the MEMS microphone based on the control signal.

9. The method according to claim 8, wherein the parameter of the MEMS microphone includes at least one parameter selected from a group consisting of a system stiffness, a system mass, a quality factor, and a mode shape.

10. The method according to claim 8, further comprising
receiving, by the controller, an external output signal from an external source; and
generating, by the controller, the control signal based on the external output signal.

11. The method according to claim 8, further comprising
receiving, by the second driven electrode, a second control signal.

12. The method according to claim 11, further comprising
determining, by the controller, a second voltage difference between the movable electrode and the second stationary electrode; and
altering, by the second driven electrode, the parameter of the MEMS microphone based on the second control signal.

13. The method according to claim 12, further comprising generating, by the controller, the second control signal based on the second voltage difference.

14. The method according to claim 13, further comprising generating, by the controller, the control signal based on the second voltage difference; and generating, by the controller, the second control signal based on the voltage difference.

15. A microphone system, the microphone system comprising:

a MEMS microphone, the MEMS microphone including a movable electrode having a first side and a second side opposite the first side, the movable electrode configured such that acoustic pressures acting on the first side and the second side of movable electrode cause movement of the movable electrode, a first stationary electrode positioned on the first side of the movable electrode, a second stationary electrode positioned on the second side of the movable electrode, a first driven electrode positioned on the first side of the movable electrode, the first driven electrode configured to receive a first control signal and alter a parameter of the MEMS microphone based on the first control signal, and a second driven electrode positioned on the second side of the movable electrode, the second driven electrode configured to receive a second control signal; and a controller coupled to the first stationary electrode, the second stationary electrode, the first driven electrode, and the second driven electrode, the controller configured to determine a voltage difference between the movable electrode and the first stationary electrode, and generate the first control signal based on the voltage difference.

16. The microphone system according to claim 15, wherein the parameter of the MEMS microphone includes at least one parameter selected from a group consisting of a system stiffness, a system mass, a quality factor, and a mode shape.

17. The microphone system according to claim 15, wherein the controller is further configured to receive an external output signal from an external source and generate the first control signal based on the external output signal.

18. The microphone system of claim 15, wherein the controller is further configured to determine a second voltage difference between the movable electrode and the second stationary electrode, and alter the parameter of the MEMS microphone based on the second control signal.

19. The microphone system according to claim 18, wherein the controller is further configured to generate the second control signal based on the second voltage difference.

20. The microphone system according to claim 19, wherein the controller is further configured to generate the control signal based on the second voltage difference, and generate the second control signal based on the voltage difference.

* * * * *